United States Patent
Yin et al.

(10) Patent No.: US 9,276,085 B2
(45) Date of Patent: Mar. 1, 2016

(54) SEMICONDUCTOR STRUCTURE AND METHOD FOR MANUFACTURING THE SAME

(75) Inventors: Huaxiang Yin, Beijing (CN); Xiaolong Ma, Beijing (CN); Changliang Qi, Beijing (CN); Qiuxia Xu, Beijing (CN); Dapeng Chen, Beijing (CN)

(73) Assignee: Institute of Microelectronics Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/387,143

(22) PCT Filed: Apr. 26, 2012

(86) PCT No.: PCT/CN2012/074776
§ 371 (c)(1),
(2), (4) Date: Sep. 22, 2014

(87) PCT Pub. No.: WO2013/139064
PCT Pub. Date: Sep. 26, 2013

(65) Prior Publication Data
US 2015/0115374 A1   Apr. 30, 2015

(30) Foreign Application Priority Data
Mar. 23, 2012   (CN) .......................... 2012 1 0080996

(51) Int. Cl.
| H01L 21/02 | (2006.01) |
| H01L 21/332 | (2006.01) |
| H01L 29/66 | (2006.01) |
| H01L 29/78 | (2006.01) |

(52) U.S. Cl.
CPC ...... *H01L 29/66575* (2013.01); *H01L 29/6656* (2013.01); *H01L 29/66636* (2013.01); *H01L 29/7833* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ........... 257/20, 194, 135–136, 213–413, 900, 257/902–903; 438/136, 137, 156, 173, 192, 438/206, 212, 424, 427, 428, 591
See application file for complete search history.

(56) References Cited

U.S. PATENT DOCUMENTS

| 6,165,826 | A | 12/2000 | Chau et al. |
| 7,138,322 | B2 | 11/2006 | Noda |
| 2007/0264765 | A1* | 11/2007 | Lan et al. ..................... 438/199 |
| 2007/0275532 | A1 | 11/2007 | Chidambarrao et al. |
| 2011/0068396 | A1 | 3/2011 | Cheng |

FOREIGN PATENT DOCUMENTS

| CN | 11 753 21 | 3/1998 |
| CN | 15 273 68 | 9/2004 |
| CN | 1 010 793 80 | 11/2007 |

* cited by examiner

*Primary Examiner* — Selim Ahmed
*Assistant Examiner* — Moin Rahman
(74) *Attorney, Agent, or Firm* — Fay Kaplun & Marcin, LLP

(57) ABSTRACT

The present invention provides a semiconductor structure comprising a substrate; a gate stack on the substrate; a spacer on the sidewalls of the gate stack; a source/drain junction extension formed in the substrate on both sides of the gate stack by epitaxial growth; and a source/drain region in the substrate on both sides of the source/drain junction extension. Accordingly, the present invention also provides methods for manufacturing the semiconductor structure. The present invention can provide a source/drain junction extension with a high doping concentration and a low junction depth, thereby effectively improving the performance of the semiconductor structure.

8 Claims, 15 Drawing Sheets

SEMICONDUCTOR STRUCTURE AND METHOD FOR MANUFACTURING THE SAME

CROSS REFERENCE TO RELATED APPLICATION

This application is a national stage application, filed under 35 U.S.C. §371, of PCT Application No. PCT/CN2012/074776 filed on Apr. 26, 2012, entitled "SEMICONDUCTOR STRUCTURE AND METHOD FOR MANUFACTURING THE SAME", which claimed priority to Chinese Patent Application Serial No. 201210080996.2 filed on Mar. 23, 2012, all of which are hereby incorporated by reference in their entirety.

TECHNICAL FIELD

The present invention relates to the field of semiconductor technology. In particular, the present invention relates to a semiconductor structure and a method for manufacturing the same.

BACKGROUND OF THE ART

Source/drain junction extension plays an important role in controlling the short channel effect of MOS devices and improving the device driving capability.

Source/drain junction extension is directly adjacent to the channel conductive region. As the gate length decreases continuously, the junction depth of the source/drain junction extension is required to be lower so as to curb the increasingly serious short-channel channel effect. However, decrease in the junction depth of the source/drain junction extension leads to a larger resistance. If the series resistance of the source/drain junction extension is not reduced timely, the parasitic resistance of the source/drain junction extension will play a dominant role in the device on-resistance, and thus affect or diminish the advantage of various strained channel technologies to improve the mobility and lower equivalent channel resistance.

In the prior art, methods such as ultra-low-energy implantation (for example, the implantation energy less than 1 keV) and high-energy transient laser annealing are usually employed to reduce the junction depth of the source/drain junction extension and to enhance the activation concentration to reduce resistance. However, with the scale-down of IC technology nodes, the requirements of the device performance for process parameters of the source/drain junction extension become increasingly rigorous, especially for the 22 nm or beyond technology. The difficulties faced by the above technologies are growing.

Therefore, it is desirable to propose a semiconductor structure and a manufacturing method thereof, which allows the semiconductor structure to have a source/drain junction extension with a high doping concentration and a low junction depth.

SUMMARY OF THE INVENTION

The present invention provides a semiconductor structure and a method for manufacturing the same to solve the above problems.

According to one aspect of the invention, a method for manufacturing a semiconductor structure is provided, in which the method comprises the following steps:

a) providing a substrate and forming a gate stack on the substrate;
b) etching the substrate with the gate stack as a mask to form a trench on both sides of the gate stack;
c) forming a source/drain junction extension in the trench;
d) forming a spacer around the gate stack to cover part of the substrate on both sides of the gate stack; and
e) forming a source/drain region in the substrate on both sides of the spacer.

According to another aspect of the invention, a method for manufacturing a semiconductor structure is further provided, in which the method comprises the following steps:

a) providing a substrate and forming a gate stack on the substrate;
b) forming an offset spacer around the gate stack and a dummy spacer around the offset spacer;
c) forming a doped region in the substrate on both sides of the offset spacer and the dummy spacer;
d) removing the dummy spacer, and part of the offset spacer located on the surface of the substrate; and
e) etching the substrate on both sides of the offset spacer to form a trench;
f) forming a source/drain junction extension in the trench;
g) forming a spacer (240) on the sidewalls of the offset spacer; and
h) forming a source/drain region in the substrate on both sides of the spacer.

According to another aspect of the invention, a method for manufacturing a semiconductor structure is further provided, in which the method comprises the following steps:

a) providing a substrate and forming a gate stack on the substrate;
b) etching the substrate on both sides of the gate stack to form a trench on both sides of the gate stack;
c) forming an offset spacer and a dummy spacer therearound on the sidewalls of the gate stack and on the sidewalls of the trench (370) thereunder;
d) forming a doped region (330*a*) in the substrate (100) on both sides of the offset spacer and the dummy spacer;
e) removing the dummy spacer (230), and part of the offset spacer located at the bottom surface and on the sidewalls of the trench;
f) forming a source/drain junction extension in the trench;
g) forming a spacer on the sidewalls of the offset spacer; and
h) forming a source/drain region in the substrate on both sides of the spacer.

According to another aspect of the invention, a semiconductor structure is further provided, comprising:
a substrate;
a gate stack, located on the substrate;
a spacer, located on the sidewalls of the gate stack;
a source/drain junction extension, which is located in the substrate on both sides of the gate stack and formed by epitaxial growth; and
a source/drain region, located in the substrate on both sides of the source/drain junction extension.

The present invention provides a technical solution which has the following advantages: a trench is formed by etching the substrate on both sides of the gate stack, and then a source/drain junction extension is formed in the trench by epitaxial growth and in-situ doping. Compared with the source/drain junction extension formed by the traditional ion implantation, it is easier to control the junction depth of the source/drain junction extension by etching, and it is much easier to control the doping concentration of the source/drain junction extension by in-situ doping during the process of epitaxial growth. Therefore, the present invention can provide a semiconductor structure with a high doping concentration and a low junction depth, thereby effectively improving the performance of the semiconductor structure.

DESCRIPTION OF THE DRAWINGS

Other characteristics, objectives and advantages of the invention will become more obvious after reading the detailed description of the non-limiting embodiments with reference to the following attached drawings, in which.

DETAILED DESCRIPTION OF THE INVENTION

Exemplary embodiments of the present disclosure will be described in more details.

Some embodiments are illustrated in the attached drawings, in which the same or similar reference numbers represent the same or similar elements or the components having the same or similar functions. The following embodiments described with reference to the drawings are only exemplary for explaining the present invention, and therefore shall not be construed as limiting the present invention. The disclosure below provides many different embodiments or examples to implement different structures of the present invention. In order to simplify the disclosure of the present invention, components and settings of specific examples are described below. Obviously, they are merely exemplary, and are not intended to limit the present invention. In addition, reference numbers and/or letters can be repeated in different examples of the invention. This repetition is used only for brevity and clarity, and does not indicate any relationship between the discussed embodiments and/or settings. Furthermore, the invention provides a variety of specific examples of processes and materials, but it is obvious to a person skilled in the art that other processes can be applied and/or other materials can be used. In addition, the following description of a structure where a first feature is "on" a second feature can comprise examples where the first and second features are in direct contact, and also can comprise examples where additional features are formed between the first and second features so that the first and second features may not be in direct contact.

Figure 1:
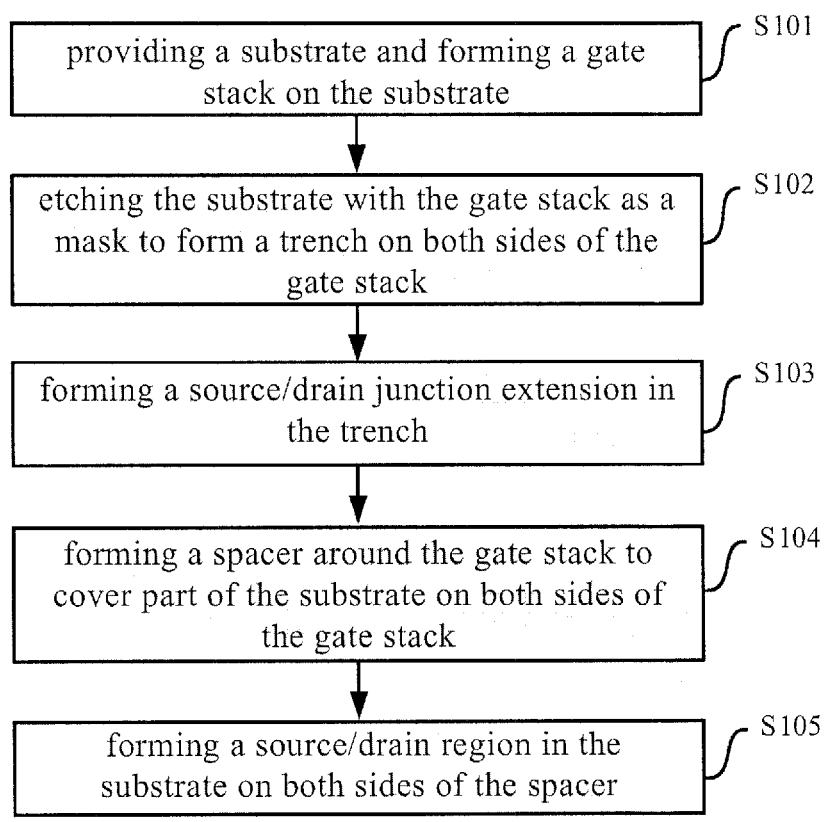
FIG. 1 is a schematic flow chart showing a method for manufacturing a semiconductor structure according to a preferred embodiment of the present invention.

According to one aspect of the invention, a method for manufacturing a semiconductor structure is provided. The method for forming a semiconductor structure in FIG. 1 will be illustrated in detail with reference to one embodiment according to the invention in combination with FIG. 1(a) to FIG. 1(i). As shown in FIG. 1, the manufacturing method provided herein comprises the following steps.

In step S101, a substrate 100 is provided and a gate stack on the substrate 100 is formed.

Figure 1A:
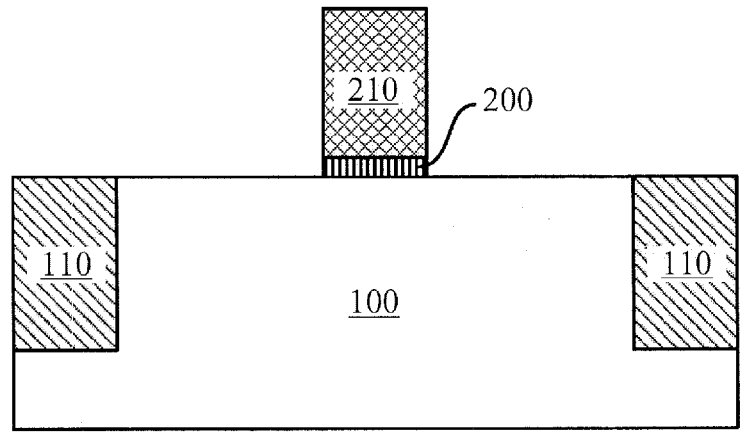
FIGS. 1(a)-1(i) are schematic cross-sectional views showing the stages of manufacturing the semiconductor structure according to the flow chart shown in FIG. 1.

Specifically, as shown in FIG. 1(a), a substrate 100 is first provided. In this embodiment, the substrate 100 is a silicon substrate (for example, a silicon wafer). According to the design requirement generally known in the art (for example, P-type substrate or N-type substrate), substrate 100 may comprise various doping configurations. In other embodiments, the substrate 100 may comprise other basic semiconductors (such as materials of Groups III-V), e.g., germanium. Alternatively, the substrate 100 may comprise compound semiconductors such as silicon carbide, gallium arsenide, and indium arsenide. Typically, the substrate 100 may have but not limited to a thickness of about a few hundred microns, for example, a thickness in the range of 400 µm to 800 µm.

Then, an isolation region is formed in the substrate 100, e.g., a shallow trench isolation (STI) structure 110, to facilitate electrical isolation of continuous field-effect transistor devices.

Then, a gate stack is formed on the substrate 100. First, a gate dielectric layer 200 is formed on the substrate 100. In this embodiment, the gate dielectric layer 200 can be formed from silicon oxide or silicon nitride, and combinations thereof, or can be formed from high-K dielectrics in other embodiments, for example, one of $HfO_2$, HfSiO, HfSiON, HfTaO, HfTiO, HfZrO, HfLaO, HfLaSiO, $Al_2O_3$, $La_2O_3$, $ZrO_2$, LaAlO, or any combination thereof, with a thickness of 1 nm to 15 nm. Afterwards, a gate 210 is formed on the gate dielectric layer 200, wherein the gate 210 can be a metal gate, for example, formed by deposition of metal nitrides, including $M_xN_y$, $M_xSi_yN_z$, $M_xAl_yN_z$, $MaAl_xSi_yN_z$, and combinations thereof, wherein M is one of Ta, Ti, Hf, Zr, Mo and W, or any combination thereof; and/or metal or metal alloys, including Co, Ni, Cu, Al, Pd, Pt, Ru, Re, Mo, Ta, Ti, Hf, Zr, W, Ir, Eu, Nd, Er, La, and combinations thereof. The gate 210 can also be a metal silicide, e.g., NiSi, CoSi, or TiSi with a thickness of 10 nm to 150 nm. In another embodiment, the gate stack can also have a dummy gate alone and do not have a gate dielectric layer 200, and the gate dielectric layer is formed by removing the dummy gate in the subsequent replacement gate process.

Hereinafter, the subsequent steps are described by taking the formation of a dummy gate stack constituted by a gate dielectric layer 200 and a dummy gate 210 as an example.

In step S102, the substrate (100) is etched with the gate stack as a mask to form a trench 300 on both sides of the gate stack.

Figure 1B:
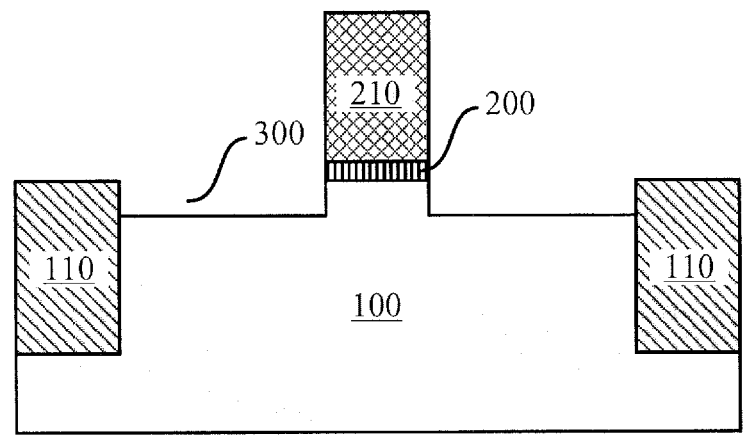

Specifically, as shown in FIG. 1(b), the substrate 100 on both sides of the dummy gate stack is etched by means of anisotropic dry etching and/or wet etching with the dummy gate stack as a mask so as to form a trench 300 (hereinafter shown as a first trench 300) on both sides of the dummy gate stack, wherein the first trench 300 has a depth in the range of 3 nm to 50 nm. In the subsequent steps, a source/drain junction extension is formed in the first trench 300. Therefore, the depth of the first trench 300 is the junction depth of the source/drain junction extension of the semiconductor structure. The dry etching and/or wet etching used to form the first trench 300 are well known etching processes to those skilled in the art and thus are not discussed herein for the sake of brevity.

In step S103, the source/drain junction extension 310 is formed in the trench 300.

Figure 1C:
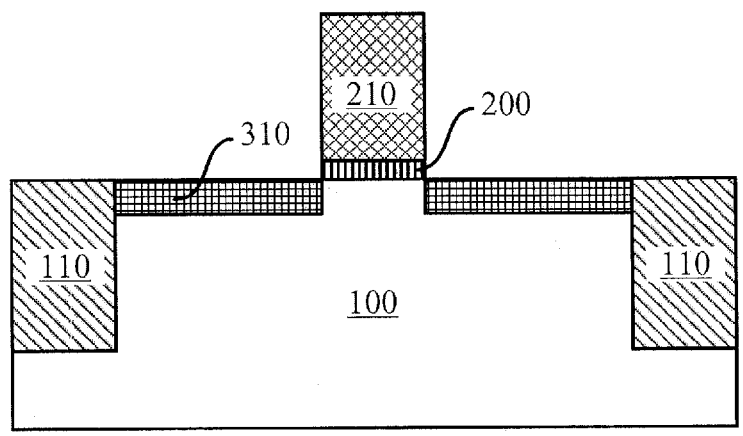

Specifically, as shown in FIG. 1(c), after the first trench 300 is formed, the trench (300) is formed in a manner such as epitaxial growth with the substrate (100) as a seed crystal, and an embedded source/drain junction extension 310 is formed by simultaneously performing in-situ doping during the process of epitaxial growth. For PMOS devices, the doped impurities are of P-type, such as boron; for NMOS devices, the doped impurities are of N-type, such as phosphorus or arsenic. The doping concentration of the impurities is in the range of $5\times10^{18}$ cm$^{-3}$ to $5\times10^{2}$ cm$^{-3}$. Preferably, the lattice constant of the material used to form a source/drain junction extension 310 is not equal to that of the material of the substrate 100, which is the alloy of a substrate material. For PMOS devices, the lattice constant of the source/drain junction extension 310 is slightly greater than that of the substrate 100, thus producing compressive stress on the channel, for example, as for $Si_{1-x}Ge_x$, X ranges from 0.1 to 0.7, such as 0.2, 0.3, 0.4, 0.5 or 0.6. For NMOS devices, the lattice constant of the source/drain junction extension 310 is slightly less than that of the substrate 100, thus producing tensile stress on the channel, such as Si:C, wherein the atomic percentage of C ranges from 0.2% to 2%, such as 0.5%, 1% or 1.5%.

In step S104, a spacer around the gate stack is formed to cover part of the substrate (100) on both sides of the gate stack.

Figure 1D:
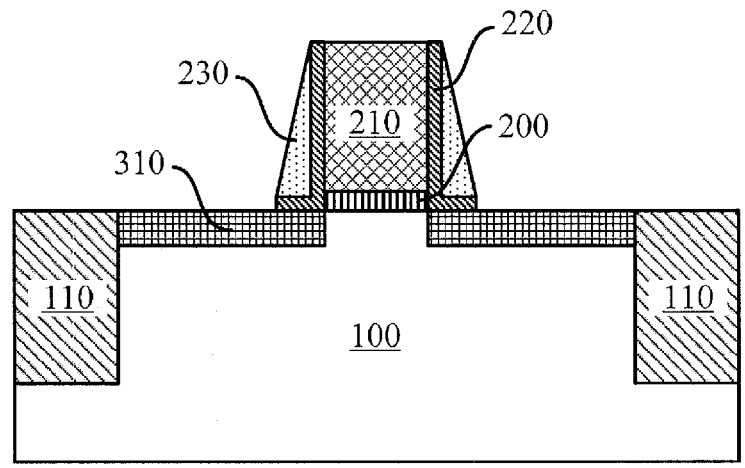

Specifically, in one embodiment, as shown in FIG. 1(d), an offset spacer 220 around the dummy gate stack and a spacer 230 (hereinafter shown as a first spacer 230) around the offset spacer 220 are formed to cover part of the substrate 100 on both sides of the dummy gate stack, while the substrate 100 region not covered by the offset spacer 220 and the first spacer 230 will be used to form a source/drain region in the subsequent steps, wherein the thickness of the offset spacer 220 is generally small.

In step S105, a source/drain junction extension 310 is formed in the substrate 100 on both sides of the spacer.

Figure 1E:
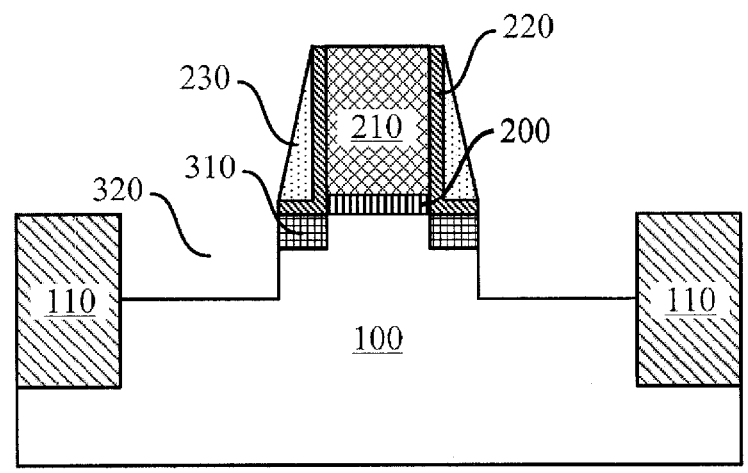

Specifically, first of all, as shown in FIG. 1(e), the substrate 100 on both sides of the spacer is etched by means of anisotropic dry etching and/or wet etching with the dummy gate stack having spacers (i.e., the offset spacer 220 and the first spacer 230) as a mask, so as to form a trench 320 (hereinafter shown as a second trench 320). Preferably, isotropic and anisotropic etching can be alternately used not only to etch the SOI substrate 100 on both sides of the spacer but also to etch part of the substrate 100 below the spacer such that the second trench 320 formed after etching is close to the channel center as much as possible.

Figure 1F:
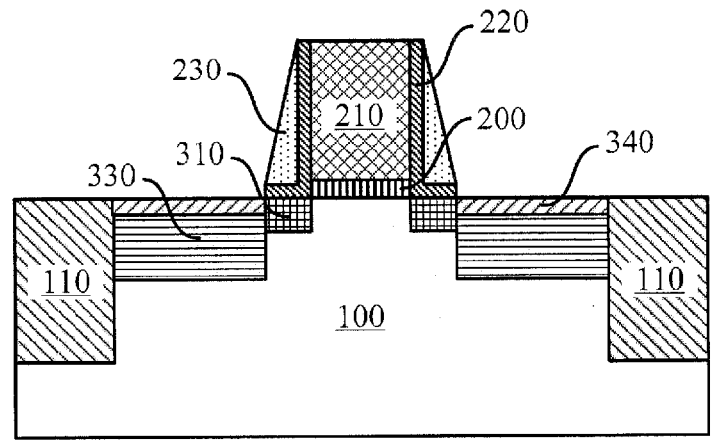

Then, as shown in FIG. 1(f), the second trench 320 is filled by manners such as epitaxial growth with the substrate 100 as a seed crystal and the filling material is doped to form an embedded source/drain region 330. Preferably, the lattice constant of the material used to form a source/drain region 330 is not equal to that of the material of the substrate 100. For PMOS devices, the lattice constant of the source/drain region 330 is slightly greater than that of the substrate 100, thus producing compressive stress on the channel, for example, as for $Si_{1-x}Ge_x$, X ranges from 0.1 to 0.7, such as 0.2, 0.3, 0.4, 0.5 or 0.6; for NMOS devices, the lattice constant of the source/drain region 330 is slightly less than that of the substrate 100, thus producing tensile stress on the channel, such as Si:C, wherein the atomic percentage of C ranges from 0.2% to 2%, such as 0.5%, 1% or 1.5%. After filling the second trench 320, the source/drain region 330 can be formed in a manner such as ion implantation or in-situ doping, or by simultaneously performing in-situ doping during the process of epitaxial growth. For PMOS devices, the doped impurities are of P-type, such as boron; for NMOS devices, the doped impurities are of N-type, such as phosphorus or arsenic. The doping concentration of the source/drain region 330, greater than that of the source/drain junction extension 310, is in the range of $1\times10^{19}$ cm$^{-3}$ to $8\times10^{20}$ cm$^{-3}$.

In other embodiments, the source/drain region 330 can also be formed in the substrate 100 on both sides of the spacer by implanting P-type or N-type dopants or impurities to the substrate 100.

Figure 1G:
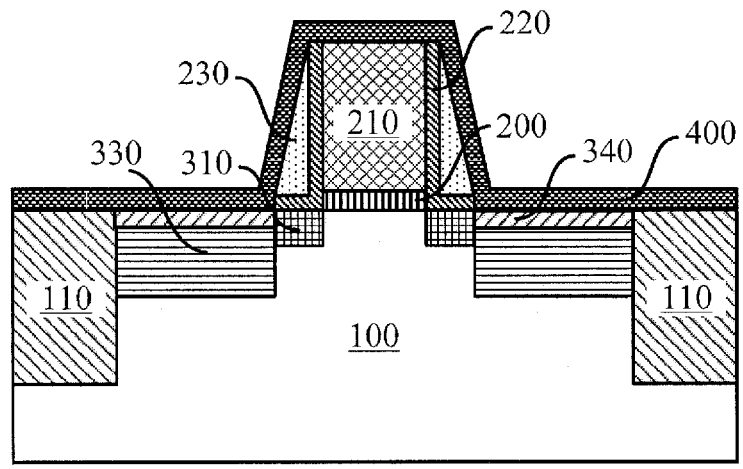
Figure 1H:
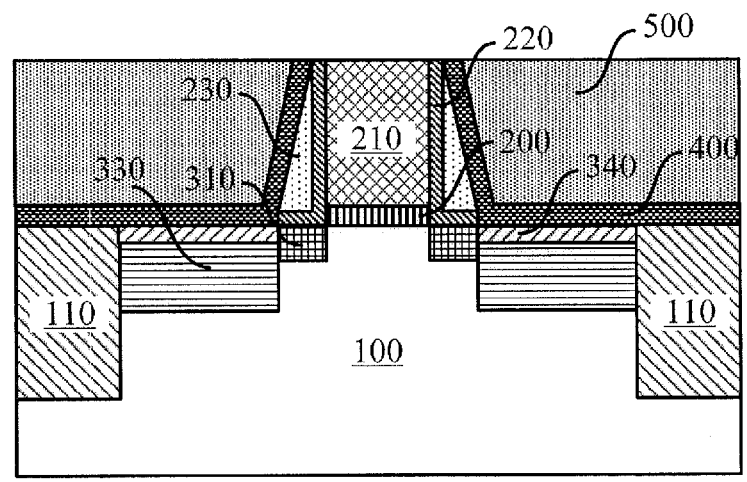
Figure 1I:
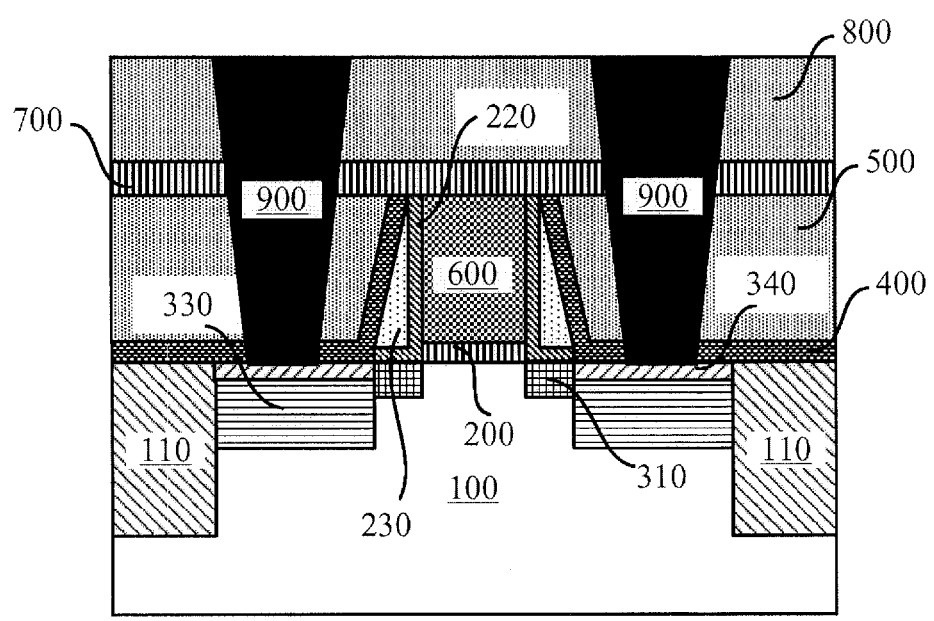

Subsequently, the manufacture of the semiconductor structure is finished in accordance with the conventional semiconductor manufacturing process steps (please refer to FIG. 1(f) to FIG. 1(i)). Specifically, as shown in FIG. 1(f), a metal silicide layer 340 is formed on the surface of the source/drain region 330 to reduce contact electric resistance; as shown in FIG. 1(g), a contact etch stop layer 400 is formed on the semiconductor structure; then, as shown in FIG. 1 (h), a first interlayer dielectric layer 500 is formed to cover the contact etch stop layer 400 by deposition and is subject to planarization operation to expose the dummy gate described 210; then, as shown in FIG. 1(i), the replacement gate operation is implemented, wherein a gate electrode layer 600 is formed on the gate dielectric layer 200, then, a cap layer 700 and a second interlayer dielectric layer 800 are formed on the first interlayer dielectric layer 500, and a contact plug 900 is formed to penetrate through the second interlayer dielectric layer 800, the cap layer 700 and the first interlayer dielectric layer 500.

Figure 2:
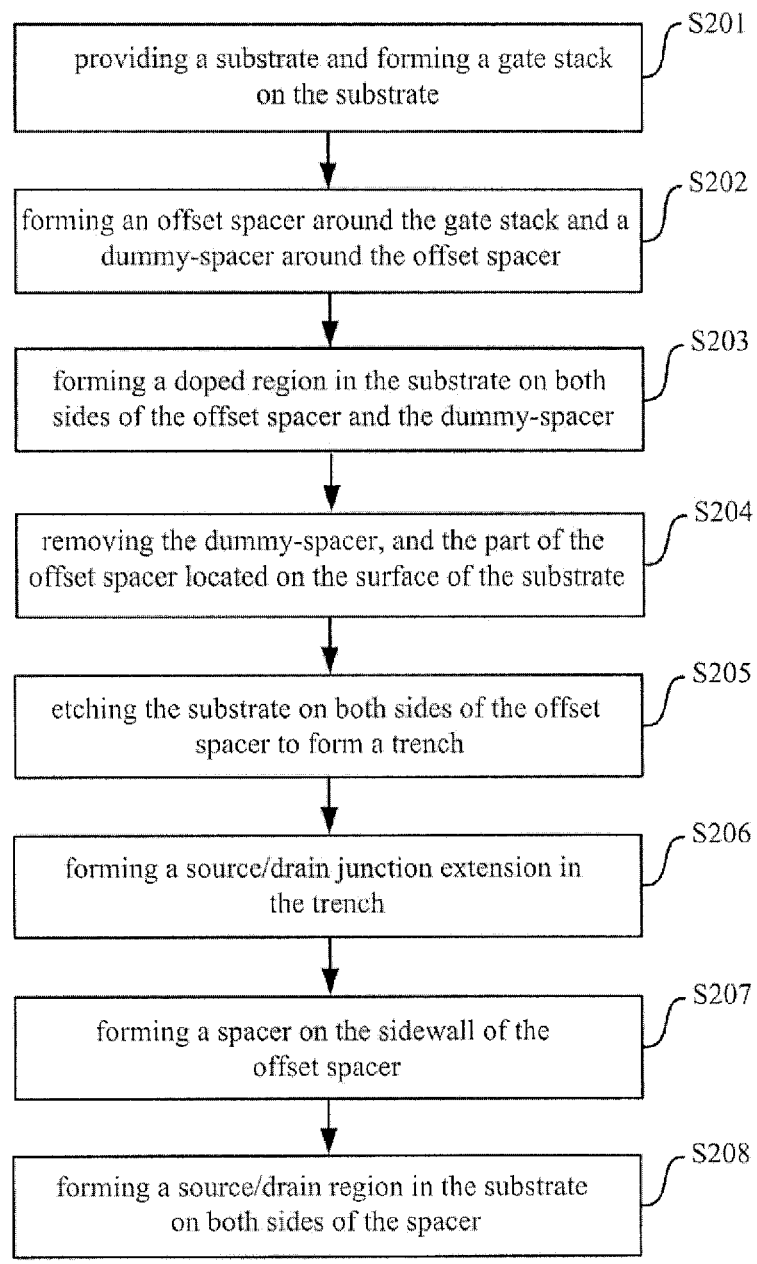
FIG. 2 is a schematic flow chart showing a method for manufacturing a semiconductor structure according to another preferred embodiment of the present invention.

According to another aspect of the present invention, a method for manufacturing a semiconductor structure is further provided. The method for manufacturing a semiconductor structure in FIG. 2 will be illustrated in detail with reference to one embodiment according to the invention in combination with FIG. 2(a) to FIG. 2(j). As shown in FIG. 2, the method for manufacturing the semiconductor structure according to the invention comprises the following steps.

Figure 2A:
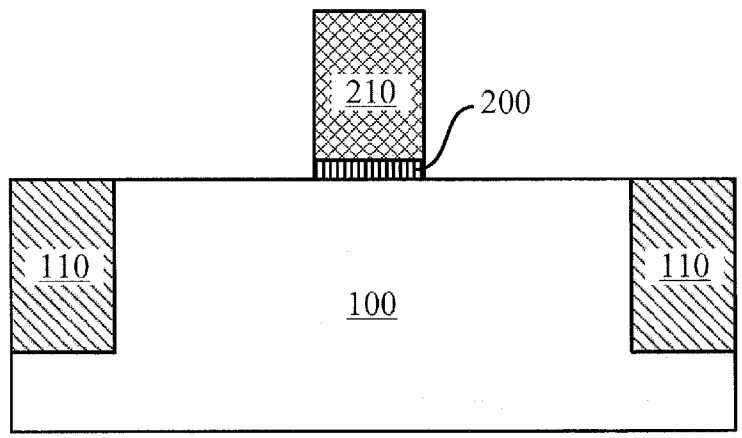
FIGS. 2(a)-2(j) are schematic cross-sectional views showing the stages of manufacturing the semiconductor structure according to the flow chart shown in FIG. 2.

In step S201, as shown in FIG. 2(a), a substrate 100 is provided and a gate stack is formed on the substrate 100. This step is the same as step S101 in the above embodiment and thus is not discussed herein. The subsequent steps are explained below in detailed description by taking the formation of a dummy gate stack constituted by a gate dielectric layer 200 and a dummy gate 210 as an example.

Figure 2B:
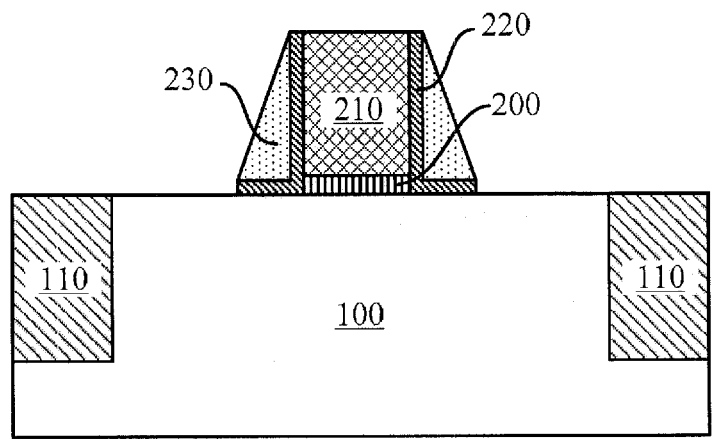

In step S202, as shown in FIG. 2(b), an offset spacer 220 around the gate stack and a dummy spacer 230 around the offset spacer 220 are formed to cover part of the substrate 100 located on both sides of the gate stack. In the subsequent steps, part or all of the substrate 100 covered by the spacer will be used to form a source/drain junction extension, wherein the thickness of the offset spacer 220 is small.

In step S203, a doped region 330a is formed in the substrate 100 on both sides of the offset spacer 220 and the dummy spacer 230.

Figure 2C:
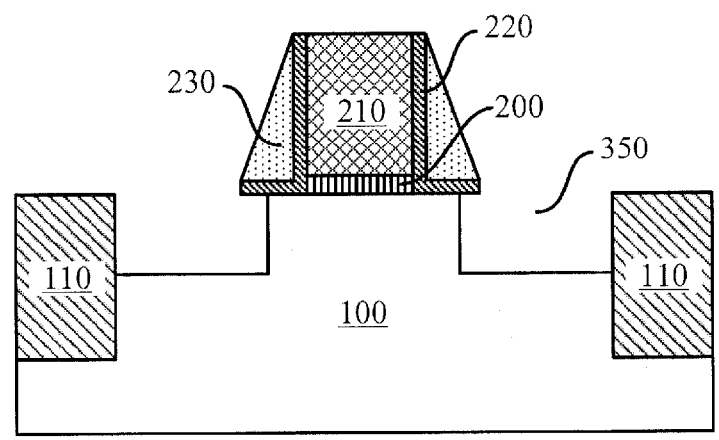

Specifically, first of all, as shown in FIG. 2(c), the substrate 100 on both sides of the spacer is etched by means of anisotropic dry etching and/or wet etching with the dummy gate stack having spacers (i.e., the offset spacer 220 and the dummy spacer 230) as a mask to form a trench 350 (hereinafter shown as a first trench 350). Preferably, isotropic and anisotropic etching can be alternately used not only to etch the substrate 100 on both sides of the spacer, but also to etch part of the substrate 100 below the spacer such that the third trench 350 formed after etching is close to the channel center as much as possible.

Figure 2D:
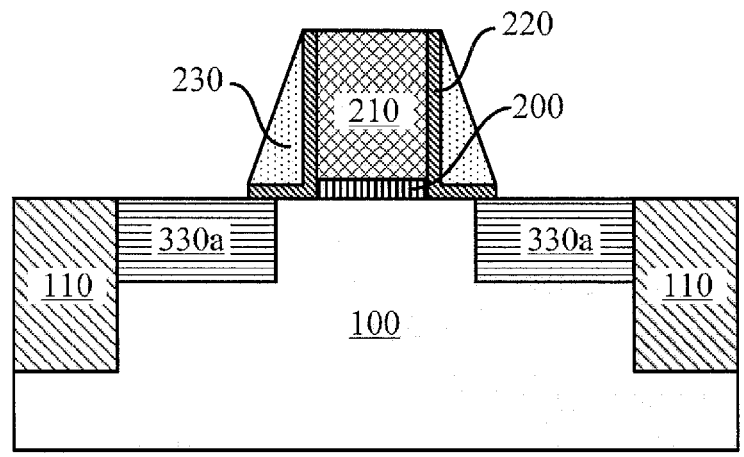

Then, as shown in FIG. 2(d), the third trench 350 is filled by manners such as epitaxial growth with the substrate 100 as a seed crystal and the filling material is doped to form an embedded doped region 330a. Preferably, the lattice constant of the filling material is not equal to that of the material of the substrate 100. For PMOS devices, the lattice constant of the filling material is slightly greater than that of the substrate 100, thus producing compressive stress on the channel, for example, as for $Si_{1-X}Ge_X$, X ranges from 0.1 to 0.7, such as 0.2, 0.3, 0.4, 0.5 or 0.6; for NMOS devices, the lattice constant of the filling material is slightly less than that of the substrate 100, thus producing tensile stress on the channel, such as Si:C, wherein the atomic percentage of C ranges from 0.2% to 2%, such as 0.5%, 1% or 1.5%. The filling material can be doped in a manner such as ion implantation or in-situ doping, or can be simultaneously doped in situ during the process of epitaxial growth so as to form a doped region 330a. For PMOS devices, the doped impurities are of P-type, such as boron; and for NMOS devices, the doped impurities are of N-type, such as phosphorus or arsenic. The doping concentration of the doped region 330a is in the range of $1\times10^{19}$ cm$^{-3}$ to $8\times10^{20}$ cm$^{-3}$.

In other embodiments, the doped region 330a can also be formed in the substrate 100 on both sides of the spacer by implanting P-type or N-type dopants or impurities into the substrate 100.

In step S204, the dummy spacer 230, and the part of the offset spacer 220 located on the surface of the substrate 100 are removed.

Figure 2E:
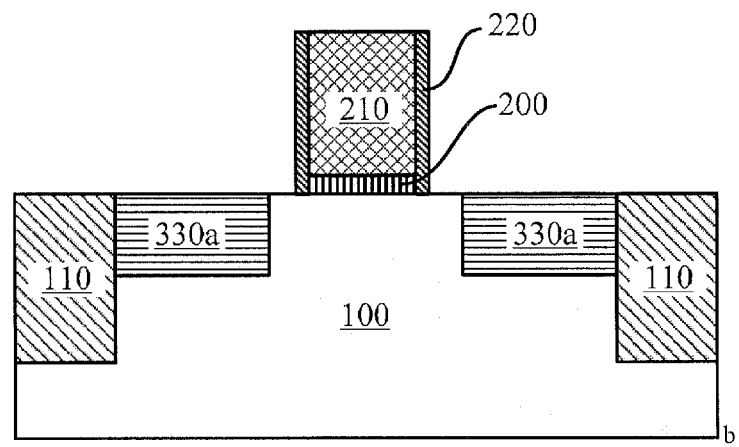

Specifically, as shown in FIG. 2(e), the dummy spacer 230, and the part of the offset spacer 220 located on the surface of the substrate 100 are removed by selective etching to expose the part of the substrate 100 located between the dummy gate stack and the doped region 330a. The offset spacer 220 located on the sidewalls of the dummy gate stack is not etched so as to protect the dummy gate stack.

In step S205, the substrate 100 on both sides of the offset spacer 220 is etched to form a trench 360.

Figure 2F:
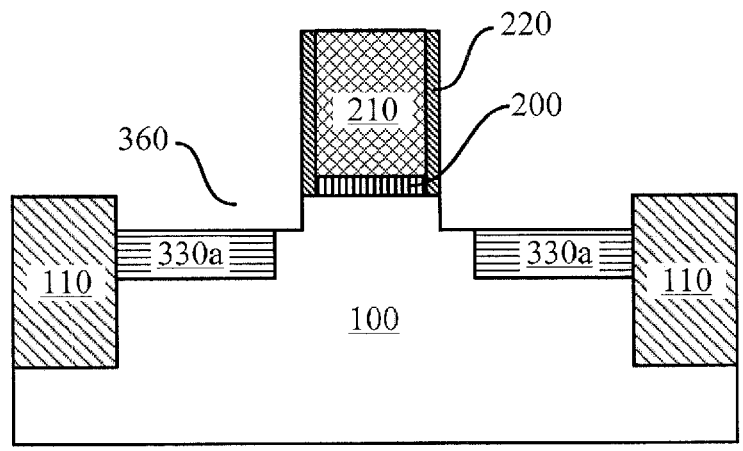

Specifically, as shown in FIG. 2(f), the non-doped substrate 100 and the doped region 330a are etched with the dummy gate stack having an offset spacer 220 as a mask to form a trench 360 (hereinafter shown as a fourth trench 360) on both sides of the dummy gate stack. The depth of the fourth trench 360, less than that of the doped region 330a, is in the range of 3 nm to 50 nm.

In step S206, a source/drain junction extension 310 is formed in the trench 360.

Figure 2G:
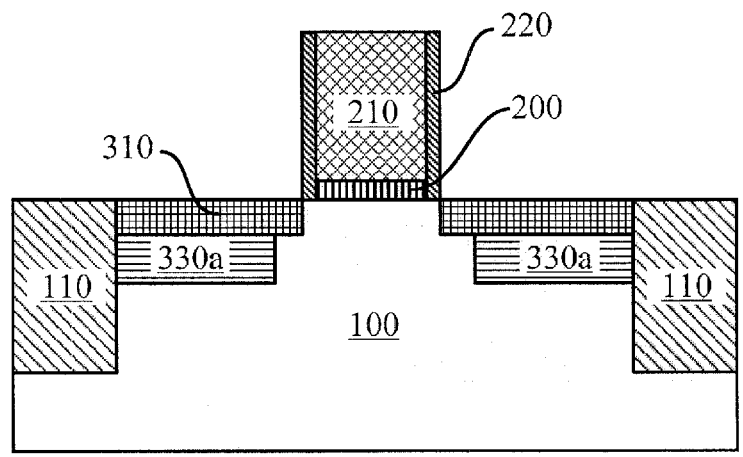

Specifically, as shown in FIG. 2(g), the fourth trench 360 is filled by manners such as epitaxial growth, and an embedded source/drain junction extension 310 is formed by simultaneously performing in-situ doping during the process of epitaxial growth. For PMOS devices, the doped impurities are of P-type, such as boron; and for NMOS devices, the doped impurities are of N-type, such as phosphorus or arsenic. The doping concentration of the impurities, less than that of the doped region 330a, is in the range of $5\times10^{18}$ cm$^{-3}$ to $5\times10^{20}$ cm$^{-3}$. Likewise, the lattice constant of the filling material is preferably not equal to that of the material of the substrate 100. For PMOS devices, the lattice constant of the filling material is slightly greater than that of the substrate 100, thus producing compressive stress on the channel, for example, as for $Si_{1-X}Ge_X$, X ranges from 0.1 to 0.7, such as 0.2, 0.3, 0.4, 0.5 or 0.6; and for NMOS devices, the lattice constant of the filling material is slightly less than that of the substrate 100, thus producing tensile stress on the channel, such as Si:C, wherein the atomic percentage of C ranges from 0.2% to 2%, such as 0.5%, 1% or 1.5%.

Figure 2H:
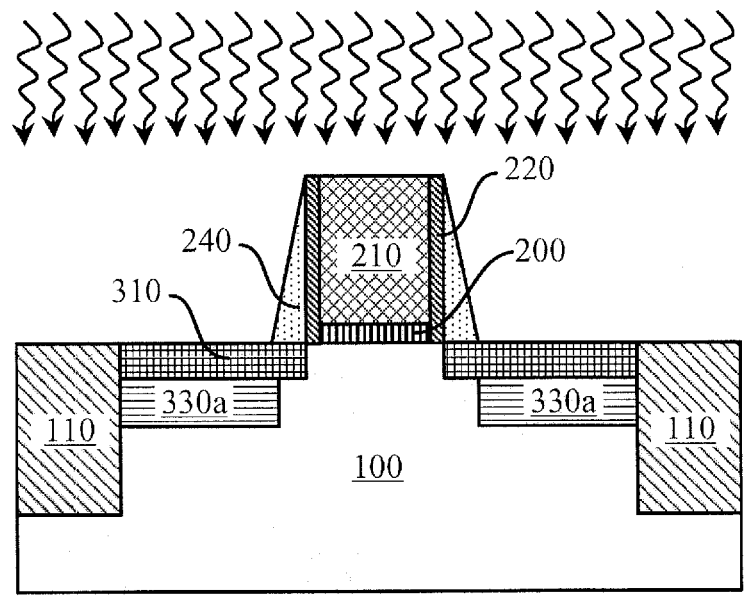

In step S207, as shown in FIG. 2(h), a spacer 240 (hereinafter shown as a second spacer 240) is formed on the sidewalls of the offset spacer 220 to cover part of the substrate 100 located on both sides of the dummy gate stack, while the substrate not covered will be used to form a source/drain region.

In step S208, a source/drain region is formed in the substrate 100 on both sides of the second spacer 240.

Figure 2I:
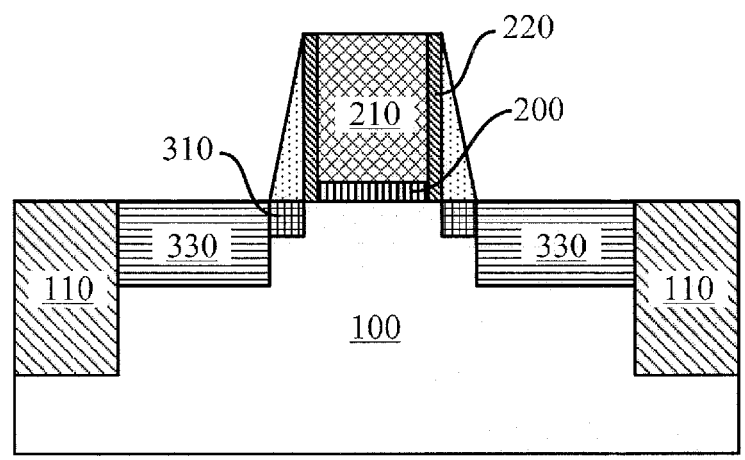

Specifically, in the formation of a source/drain region, the doping concentration of the material in the fourth trench 360 is less than that of the doped region 330a. Thus, in order to form a source/drain region, the substrate 100 located on both sides of the second spacer 240 needs to be further doped generally by ion implantation and annealing processes, as shown by the arrows in FIG. 2(h), wherein the doping concentration is in the range of $1\times10^{19}$ cm$^{-3}$ to $8\times10^{20}$ cm$^{-3}$. After doping, as shown in FIG. 2(i), a heavily doped source/drain region 330 is formed on both sides of the second spacer 240.

Figure 2J:
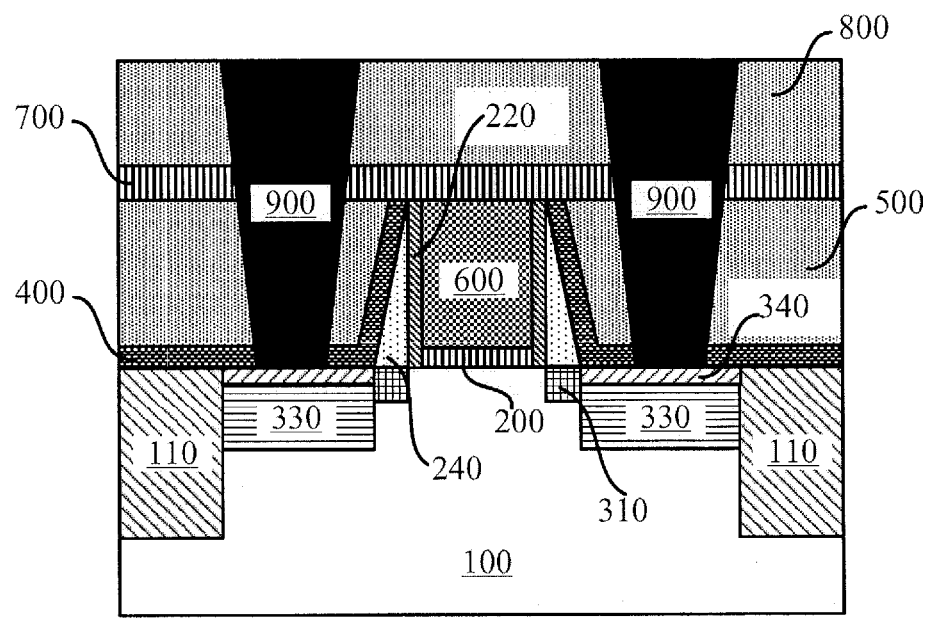

Subsequently, the manufacture of the semiconductor structure is finished in accordance with the conventional semiconductor manufacturing process steps, i.e., as shown in FIG. 2(j), a metal silicide layer 340 is formed on the surface of the source/drain region 330, a contact etch stop layer 400 and a first interlayer dielectric layer 500 are formed on the semiconductor structure, and then the replacement gate operation is implemented to form a gate electrode layer 600, a cap layer 700 that covers the semiconductor structure, a second interlayer dielectric layer 800, and a contact plug 900 penetrating through the second interlayer dielectric layer 800, the cap layer 700 and the first interlayer dielectric layer 500.

Figure 3:
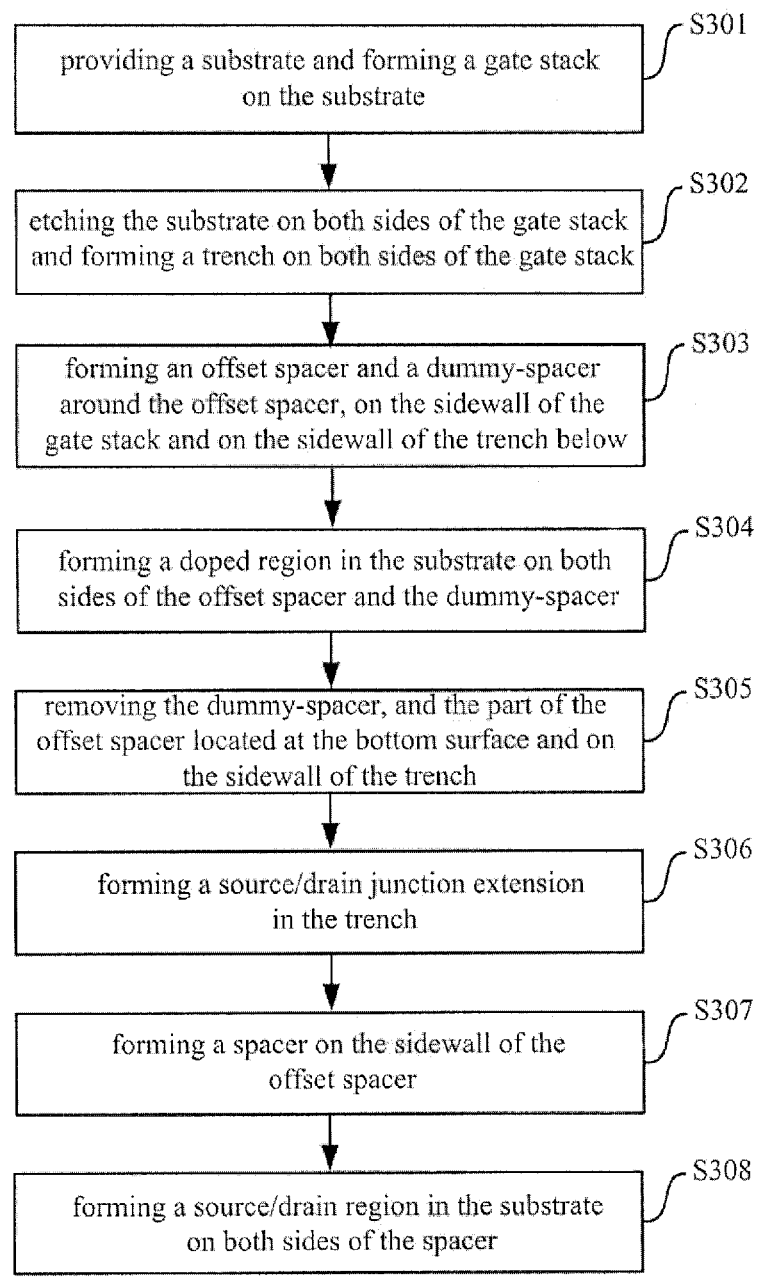
FIG. 3 is a schematic flow chart showing a method for manufacturing a semiconductor structure according to another preferred embodiment of the present invention.

According to another aspect of the present invention, a method for manufacturing a semiconductor structure is further provided. The method for manufacturing a semiconductor structure in FIG. 3 will be illustrated in detail with reference to one embodiment according to the invention in combination with FIG. 3(a) to FIG. 3(j). As shown in FIG. 3, the method for manufacturing the semiconductor structure according to the invention comprises the following steps.

Figure 3A:
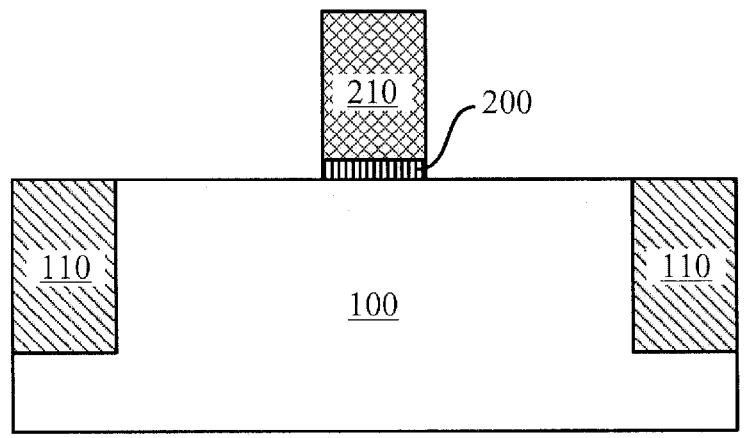
FIGS. 3(a)-3(j) are schematic cross-sectional views showing the stages of manufacturing the semiconductor structure according to the flow chart shown in FIG. 3.

In step S301, as shown in FIG. 3(a), a substrate 100 is provided and a gate stack is formed on the substrate 100. This step is the same as step S101 in the above embodiment and thus is not discussed herein. The subsequent steps are explained below in detailed description by taking the formation of a dummy gate stack constituted by a gate dielectric layer 200 and a dummy gate 210 as an example.

In step S302, the substrate 100 on both sides of the gate stack is etched and a trench 370 is formed on both sides of the gate stack.

Figure 3B:
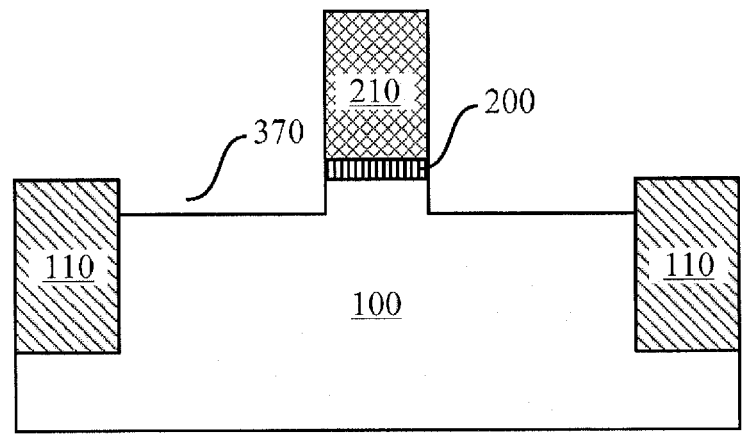

Specifically, as shown in FIG. 3(b), the substrate 100 on both sides of the dummy gate stack is etched by means of anisotropic dry etching and/or wet etching with the dummy gate stack as a mask so as to form a trench 370 (hereinafter shown as a fifth trench 370) on both sides of the dummy gate stack, wherein the depth of the fifth trench 370 is in the range of 3 nm to 50 nm.

Figure 3C:
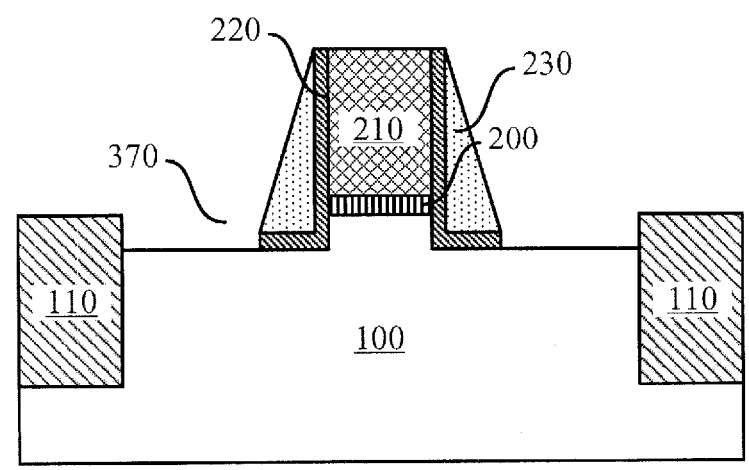

In step S303, as shown in FIG. 3(c), an offset spacer 220 and a dummy spacer 230 around the offset spacer 220 are formed on the sidewalls of the gate stack and on the sidewalls of the fifth trench 370 below, wherein the thickness of the offset spacer 220 is generally small.

In step S304, a doped region 330a is formed in the substrate 100 on both sides of the offset spacer 220 and the dummy spacer 230.

Figure 3D:
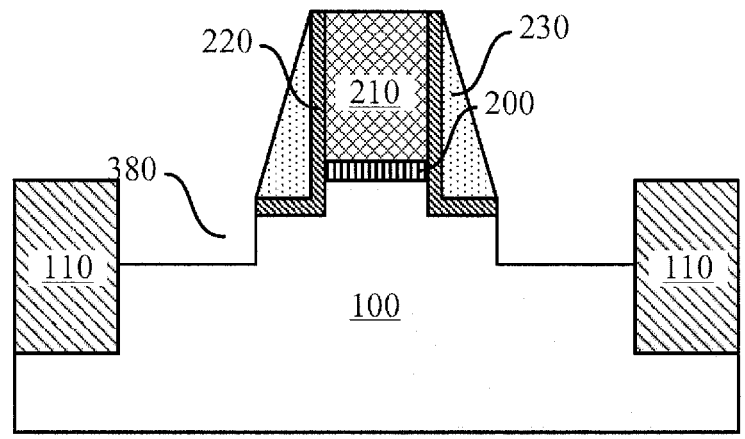

Specifically, first of all, as shown in FIG. 3(d), the substrate 100 located on both sides of the gate stack is further etched with a dummy gate stack having a spacer as a mask to form a trench 380 (hereinafter shown as a sixth trench 380) on both sides of the offset spacer 220 and the dummy spacer 230, wherein the depth of the sixth trench 380 is in the range of 10 nm to 150 nm.

Figure 3E:
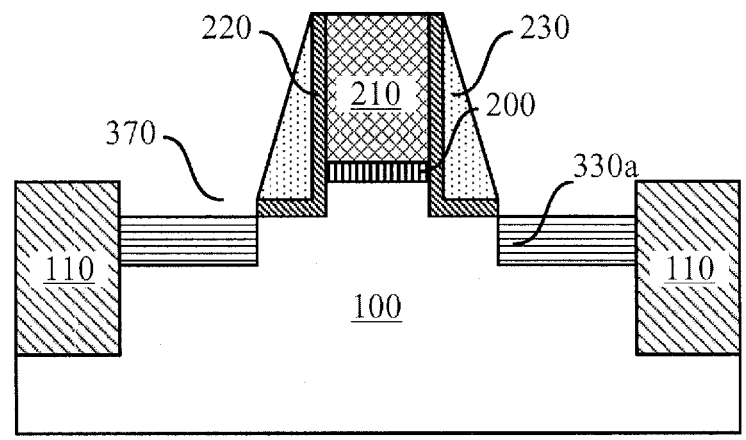

Then, as shown in FIG. 3(e), the sixth trench 380 is filled by manners such as epitaxial growth with the substrate 100 as a seed crystal to form a doped region 330a, wherein the upper surface of the doped region 330a is at the same level as the lower surface of the offset spacer 220. Preferably, the lattice constant of the filling material is not equal to that of the material of the substrate 100. For PMOS devices, the lattice constant of the filling material is slightly greater than that of the substrate 100, thus producing compressive stress on the channel, for example, as for $Si_{1-x}Ge_x$, X ranges from 0.1 to 0.7, such as 0.2, 0.3, 0.4, 0.5 or 0.6; and for NMOS devices, the lattice constant of the filling material is slightly less than that of the substrate 100, thus producing tensile stress on the channel, such as Si:C, wherein the atomic percentage of C ranges from 0.2% to 2%, such as 0.5%, 1% or 1.5%. The filling material can be doped in a manner such as ion implantation or in-situ doping, or can be simultaneously doped in situ during the process of epitaxial growth so as to form a doped region 330a. For PMOS devices, the doped impurities are of P-type, such as boron; for NMOS devices, the doped impurities are of N-type, such as phosphorus or arsenic. The doping concentration of the doped region 330a is in the range of $1 \times 10^{19}$ $cm^{-3}$ to $8 \times 10^{20}$ $cm^{-3}$.

In other embodiments, the doped region 330a can also be formed in the substrate 100 on both sides of the dummy gate stack having a spacer by implanting P-type or N-type dopants or impurities into the substrate 100.

In step S305, the dummy spacer 230, and the part of the offset spacer 220 located at the bottom surface and on the sidewalls of the trench 370 are removed.

Figure 3F:
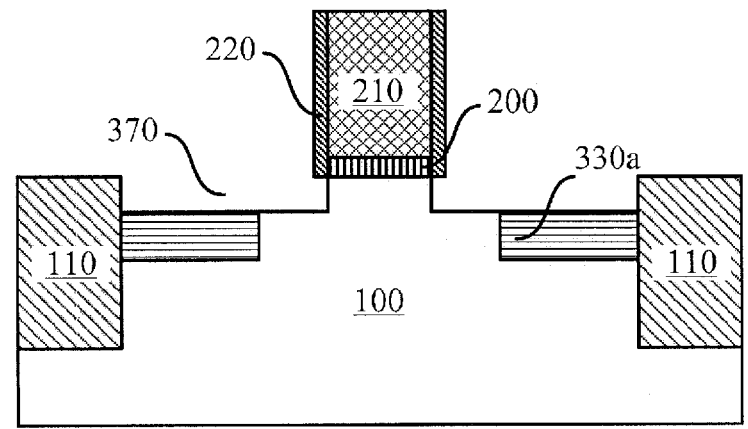

Specifically, as shown in FIG. 3(f), the dummy spacer 230 is removed by selective etching; and then, the anisotropy ratio of the dry etching is adjusted by gradually changing the gas, ratio, power and pressure in the dry etching so as to achieve the anisotropic etching of the bottom to gradually remove the part of the offset spacer 220 located at the bottom surface and on the sidewalls of the trench 370.

In step S306, a source/drain junction extension 310 is formed in the trench 370.

Figure 3G:
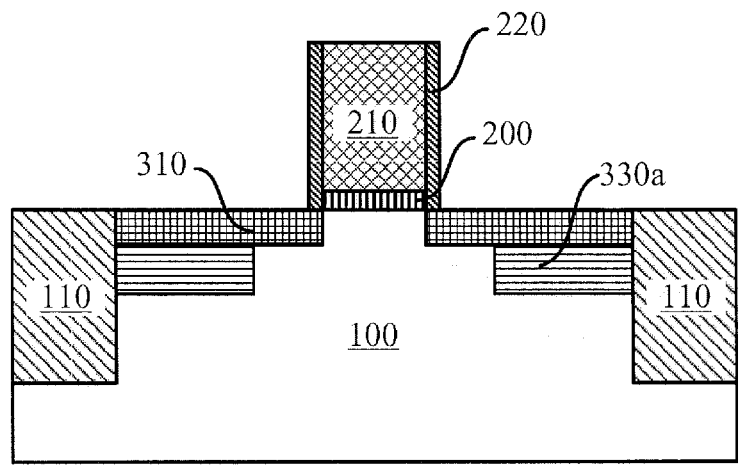

Specifically, as shown in FIG. 3(g), the fifth trench 370 is filled by manners such as epitaxial growth with the substrate 100 as a seed crystal and an embedded source/drain junction extension 310 is formed by simultaneously performing in-situ doping during the process of epitaxial growth. For PMOS devices, the doped impurities are of P-type, such as boron; and for NMOS devices, the doped impurities are of N-type, such as phosphorus or arsenic. The doping concentration of the impurities, less than that of the doped region 330a, is in the range of $5 \times 10^{18}$ $cm^{-3}$ to $5 \times 10^{20}$ $cm^{-3}$. Preferably, the lattice constant of the material used to form a source/drain junction extension 310 is not equal to that of the material of the substrate 100. For PMOS devices, the lattice constant of the source/drain junction extension 310 is slightly greater than that of the substrate 100, thus producing compressive stress on the channel, for example, as for $Si_{1-x}Ge_x$, X ranges from 0.1 to 0.7, such as 0.2, 0.3, 0.4, 0.5 or 0.6; for NMOS devices, the lattice constant of the source/drain junction extension 310 is slightly less than that of the substrate 100, thus producing tensile stress on the channel, such as Si:C, wherein the atomic percentage of C ranges from 0.2% to 2%, such as 0.5%, 1% or 1.5%.

Figure 3H:
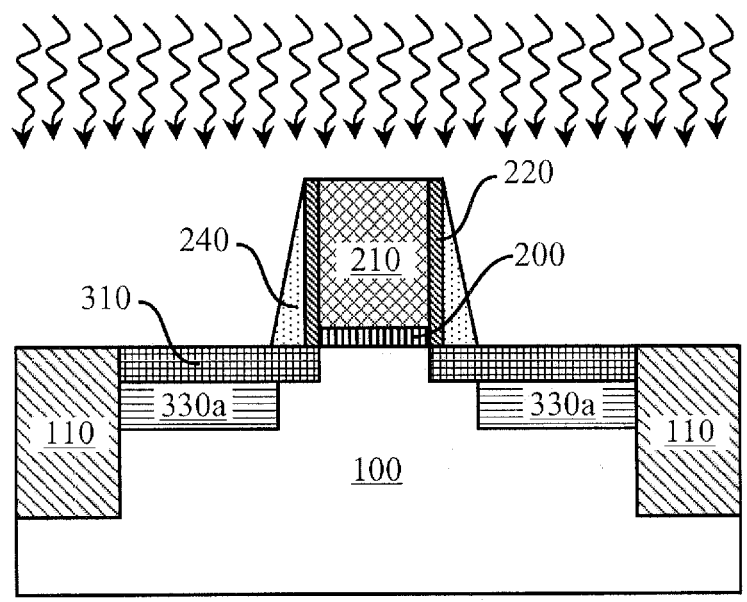

In step S307, as shown in FIG. 3(h), a spacer 240 (hereinafter shown as a third spacer 240) is formed on the sidewalls of the offset spacer 220 to cover part of the substrate 100 located on both sides of the dummy gate stack, while the substrate 100 not covered will be used to form a source/drain region.

In step S308, a source/drain region 330 is formed in the substrate 100 on both sides of the third spacer 240.

Figure 3I:
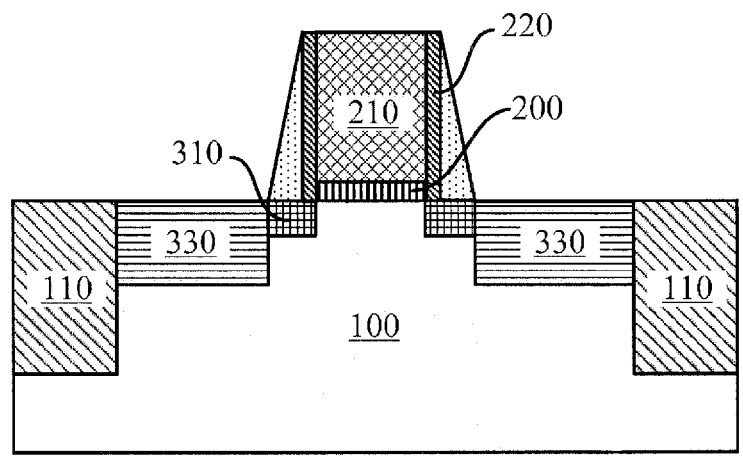
Figure 3J:
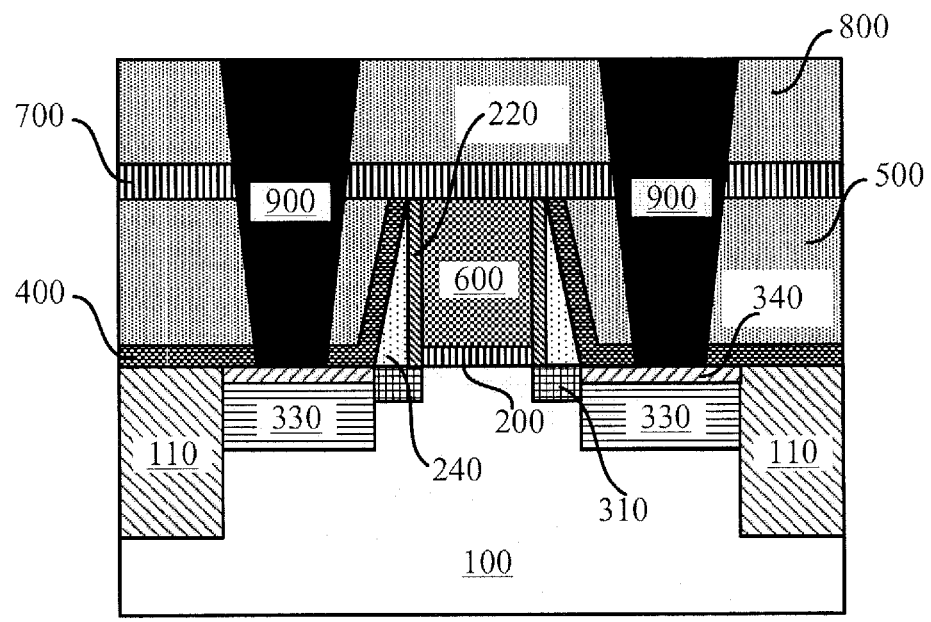

Specifically, in the formation of a source/drain junction extension, the doping concentration of the material in the fifth trench 370 is less than that of the doped region 330a. Thus, in order to form a source/drain region, the substrate 100 located on both sides of the third spacer 240 needs to be further doped, as shown by the arrows in FIG. 3(h), wherein the doping concentration is in the range of $1 \times 10^{19}$ $cm^{-3}$ to $8 \times 10^{20}$ $cm^{-3}$. After doping, as shown in FIG. 3(i), a heavily doped source/drain region 330 is formed on both sides of the third spacer 240.

Subsequently, the manufacture of the semiconductor structure is finished in accordance with the conventional semiconductor manufacturing process steps, i.e., as shown in FIG. 3(k), a metal silicide layer 340 is formed on the surface of the source/drain region 330, a contact etch stop layer 400 and a first interlayer dielectric layer 500 are formed on the semiconductor structure, the replacement gate operation is implemented to form a gate electrode layer 600, a cap layer 700 that covers the semiconductor structure, a second interlayer dielectric layer 800, and a contact plug 900 penetrating through the second interlayer dielectric layer 800, the cap layer 700 and the first interlayer dielectric layer 500.

In the above three embodiments, trenches are formed by etching the substrate on both sides of the gate stack and then source/drain junction extensions are formed in the trenches by means of epitaxial growth and in-situ doping. Compared with the traditional manner of forming a source/drain junction extension by ion implantation, it is easier to control the junction depth of the source/drain junction extension by etching, and it is much easier to control the doping concentration of the source/drain junction extension by in-situ doping during the process of epitaxial growth. Therefore, a semiconductor structure with a high doping concentration and a low junction depth can be formed by using the manufacturing method provided in the invention, thereby effectively improving the performance of the semiconductor structure.

According to another aspect of the present invention, a semiconductor structure is further provided (please refer to FIG. 1(i) and FIG. 2(j)). As shown in the figures, the semiconductor structure comprises:

a substrate 100;

a gate stack, located on the substrate 100;

a spacer, located on the sidewalls of the gate stack;

a source/drain junction extension 310, which is located in the substrate 100 on both sides of the gate stack and formed by epitaxial growth; and a source/drain region 330, located in the substrate on both sides of the source/drain junction extension 310.

Specifically, in this embodiment, the substrate 100 is a silicon substrate (e.g., a silicon wafer). According to the design requirement generally known in the art (for example, P-type substrate or N-type substrate), substrate 100 may comprise various doping configurations. In other embodiments, the substrate 100 may comprise other basic semiconductors (such as materials of Groups III-V), e.g., germanium. Alternatively, the substrate 100 may comprise compound semiconductors such as silicon carbide, gallium arsenide, and indium arsenide. Typically, the substrate 100 may have but not limited to a thickness of about a few hundred microns, for example, a thickness in the range of 400 μm to 800 μm. The substrate 100 has an isolation region, e.g., a shallow trench isolation (STI) structure 110 to facilitate electrical isolation of continuous field-effect transistor devices.

The gate stack is located on the substrate 100. As shown in the figures, the gate stack comprises a gate dielectric layer 200 and a gate electrode layer 610, wherein the gate dielectric layer 200 is located on the substrate 100 and the gate electrode layer 610 is located on the gate dielectric layer 200. In this embodiment, the materials of the gate dielectric layer are high-K dielectrics, for example, one of $HfO_2$, HfSiO, HfSiON, HfTaO, HfTiO a HfZrO, HfLaO, HfLaSiO, $Al_2O_3$, $La_2O_3$, $ZrO_2$, LaAlO, or any combination thereof, with a thickness of 1 nm to 15 nm. The gate electrode layer 610 is a metal nitride, including $M_xN_y$, $M_xSi_yN_z$, $M_xAl_yN_z$, $MaAl_x$-$Si_yN_z$, and combinations thereof, wherein M is Ta, Ti, Hf, Zr, Mo, W, and combinations thereof; and/or a metal or metal alloy, including Co, Ni, Cu, Al, Pd, Pt, Ru, Re, Mo, Ta, Ti, Hf, Zr, W, Ir, Eu, Nd, Er, La, and combinations thereof. The gate electrode layer 610 can also be a metal silicide, including NiSi, CoSi and TiSi with a thickness in the range of 10 nm to 150 nm.

A spacer is provided on the sidewalls of the gate stack. The materials of the spacer include silicon nitride, silicon oxide, silicon oxynitride, silicon carbide, and combinations thereof, and/or other suitable materials. Preferably, there may exist two or more layers of spacers.

The source/drain junction extension 310 is located in the substrate 100 on both sides of the gate stack and is formed by epitaxial growth. The source/drain junction extension 310 comprises P-type or N-type dopants or impurities (for example, for PMOS devices, the doped impurities are boron; and for NMOS devices, the doped impurities are arsenic). The source/drain junction extension 310 has a junction depth in the range of 3 nm to 50 nm and a doping concentration in the range of $5\times10^{18}$ $cm^{-3}$ to $5\times10^{20}$ $cm^{-3}$. In this embodiment, the source/drain junction extension 310 is an embedded source/drain region. The lattice constant of the material of the source/drain junction extension 310 is slightly greater than or less than that of the material of the substrate 100, thus producing stress on the channel to improve the mobility of the carrier in the channel. For PMOS devices, the lattice constant of the source/drain junction extension 310 is slightly greater than that of the material of the substrate 100, thus producing compressive stress on the channel, for example, as for $Si_{1-x}Ge_x$, X ranges from 0.1 to 0.7, such as 0.2, 0.3, 0.4, 0.5 or 0.6; for NMOS devices, the lattice constant of the source/drain junction extension 310 is slightly less than that of the substrate 100, thus producing tensile stress on the channel, such as Si:C, wherein the atomic percentage of C ranges from 0.2% to 2%, such as 0.5%, 1% or 1.5%. Compared with the source/drain junction extension formed by the traditional manner of ion implantation, the source/drain junction extension 310 provided in the invention has a regular shape. In this embodiment, the cross-section of the source/drain junction extension 310 (the cross-section perpendicular to the extending direction of the gate stack) is a regular rectangular shape.

The source/drain region 330 is adjacent to the source/drain junction extension 310, i.e., located in the substrate on both sides of the source/drain junction extension 310. The doping types of the source/drain region 330 are consistent with those of the source/drain junction extension 310, but the doping concentration of the source/drain region 330 is greater than that of the source/drain junction extension 310. The doping concentration of the source/drain region 330 is in the range of $1\times10^{19}$ $cm^{-3}$ to $8\times10^{20}$ $cm^{-3}$. In this embodiment, the source/drain region 330 is an embedded source/drain region, the materials of which are the same as those of the source/drain junction extension 310. Preferably, the surface of the source/drain region 330 further has a metal silicide layer 340 to reduce the contact electrical resistance of the semiconductor structure.

The semiconductor structure further comprises a contact etch stop layer 420, a first interlayer dielectric layer 500, a cap layer 700, a second interlayer dielectric layer 800 and a contact plug 900, wherein the contact etch stop layer 420 is provided on the sidewalls of the spacer 220 and on the surface of the substrate 100, the contact etch stop layer 420 further having a first interlayer dielectric layer 500, a cap layer 700, and a second interlayer dielectric layer 800 thereon successively. The contact plug 900 penetrates through the second interlayer dielectric layer 800, the cap layer 700, the first layer dielectric layer 500 and the contact etch stop layer 420, and is in contact with the source/drain region 330.

The source/drain junction extension of the semiconductor structure provided in the present invention has a high doping concentration and a low junction depth, thus effectively improving the performance of the semiconductor structure.

Although the exemplified embodiments and the advantages thereof have been illustrated in detail, it is understood that any modification, replacement and change can be made to these embodiments without departing from the spirit of the invention and the scope defined in the attaching claims. As to other examples, a person skilled in the art can easily understand that the order of the process steps can be modified without falling outside the protection scope of the invention.

In addition, the application fields of the invention are not limited to the processes, mechanism, fabrication, material composition, means, methods and steps in the particular embodiments as given in the description. From the disclosure of the invention, a person skilled in the art can easily understand that, as for the processes, mechanism, fabrication, material composition, means, methods or steps present or to be developed, which are carried out to realize substantially the same function or obtain substantially the same effects as the corresponding examples described according to the invention, such processes, mechanism, fabrication, material composition, means, methods or steps can be applied according to the invention. Therefore, the claims attached to the invention are intended to encompass the processes, mechanism, fabrication, material composition, means, methods or steps into the protection scope thereof.

We claim:

1. A method for manufacturing a semiconductor structure, comprising
   a) providing a substrate (100) and forming a gate stack on the substrate (100)
   b) forming an offset spacer (220) around the gate stack and a dummy spacer (230) around the offset spacer (220);
   c) forming a doped region (330a) in the substrate (100) on both sides of the offset spacer (220) and the dummy spacer (230)
   d) removing the dummy spacer (230), and a lower portion of the offset spacer (220) entirely located on the surface of the substrate (100) up to a gate dielectric layer (200); and
   e) etching the substrate (100) on both sides of the offset spacer (220) to form a trench (360)
   f) forming a source/drain junction extension (310) in the trench (360)
   g) forming a spacer (240) on sidewalls of the offset spacer (220); and
   h) forming a source/drain region (330) in the substrate (100) on both sides of the spacer (240).

2. The method according to claim 1, wherein the step c) comprises:
   etching the substrate (100) with the gate stack having the offset spacer (220) and the dummy spacer (230) as a mask to form a trench (350) on both sides of the gate stack; and
   forming a doped region (330a) in the trench (350) by means of epitaxial growth with the substrate (100) as a seed crystal.

3. The method according to claim 1, wherein the step f) comprises:
    filling the trench (360) by means of epitaxial growth with the substrate (100) as a seed crystal, and simultaneously performing in-situ doping to form a source/drain junction extension (310).

4. The method according to claim 1, wherein the material of the source/drain junction extension (310) and/or the source/drain region (330) is an alloy of the substrate material.

5. The method according to claim 4, wherein:
    for N-type devices, the lattice constant of the material of the source/drain junction extension (310) and/or the source/drain region (330) is less than or equal to that of the material of the substrate (100); and
    for P-type devices, the lattice constant of the material of the source/drain junction extension (310) and/or the source/drain region (330) is greater than or equal to that of the material of the substrate (100).

6. The method according to claim 1, wherein the junction depth of the source/drain junction extension (310) is in the range of 3 nm to 50 nm, and the doping concentration is from $5\times10^{18}$ cm$^{-3}$ to $5\times10^{20}$ cm$^{-3}$.

7. The method according to claim 1, wherein the step h) comprises:
    forming a source/drain region (330) by ion implantation to the substrate (100) on both sides of the spacer (240).

8. The method according to claim 1, wherein the gate stack comprises a gate dielectric layer (200) and a dummy gate (210).

\* \* \* \* \*